(12) United States Patent  
McCann

(10) Patent No.: US 6,320,131 B1  
(45) Date of Patent: Nov. 20, 2001

(54) SINGLE PIECE, HINGED CABLE ROUTING DEVICE

(75) Inventor: Andrew F. McCann, Lawrenceville, GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/450,547

(22) Filed: Nov. 30, 1999

(51) Int. Cl.[7] ....................................................... H01B 7/06
(52) U.S. Cl. .............................. 174/69; 174/86; 361/730; 439/165
(58) Field of Search ...................... 174/69, 72 A, 174/86; 16/223; 361/730, 729; 429/162–165

(56) References Cited

U.S. PATENT DOCUMENTS 3,399,909 * 9/1968 Ambrose .
4,614,383 * 9/1986 Polley et al. .......................... 174/69
6,076,779   6/2000 Johnson .

* cited by examiner

*Primary Examiner*—Khiem Nguyen
(74) *Attorney, Agent, or Firm*—Hubert J. Barnhardt, III; Kenneth M. Massaroni; Kelly A. Gardner

(57) ABSTRACT

Systems and methods for providing for a single piece, hinged cable routing device for use with cables. The device includes sections hingedly connected allowing each section to flex and bend. The device can include fingers on an upper portion of the device. Upon pushing a cable through the fingers, the cable securely remains in position within the device. In a preferred embodiment, the device connects cables to an amplifier housing in a cable television network. When the amplifier housing closes, the device folds securely within the amplifier housing ensuring the cable remains in a position within the amplifier housing that avoids electrical interference and noise.

6 Claims, 3 Drawing Sheets

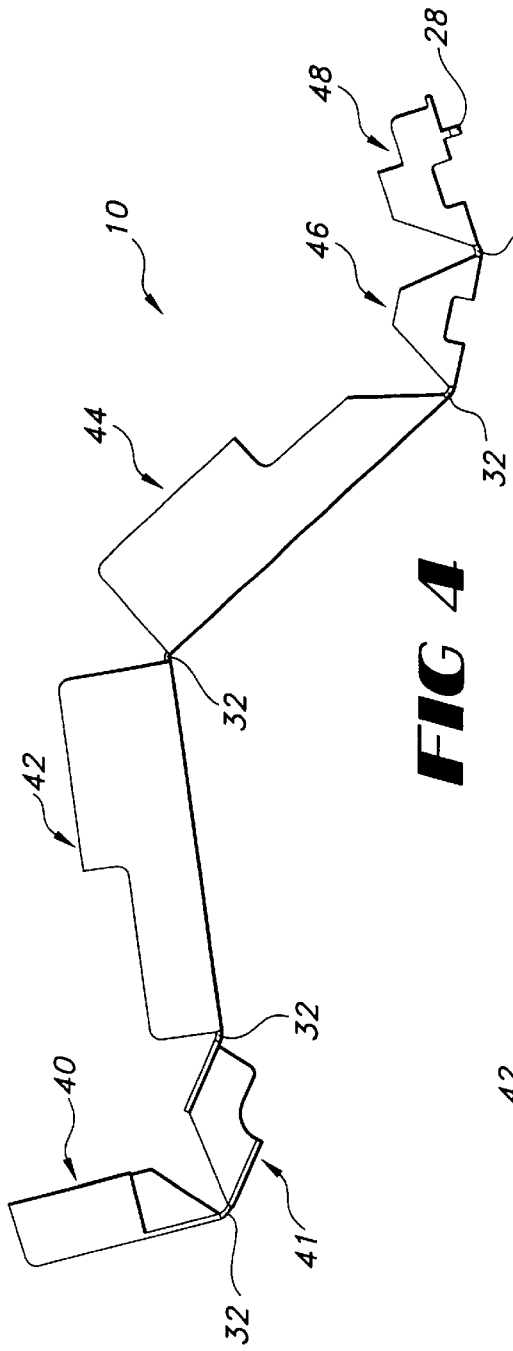
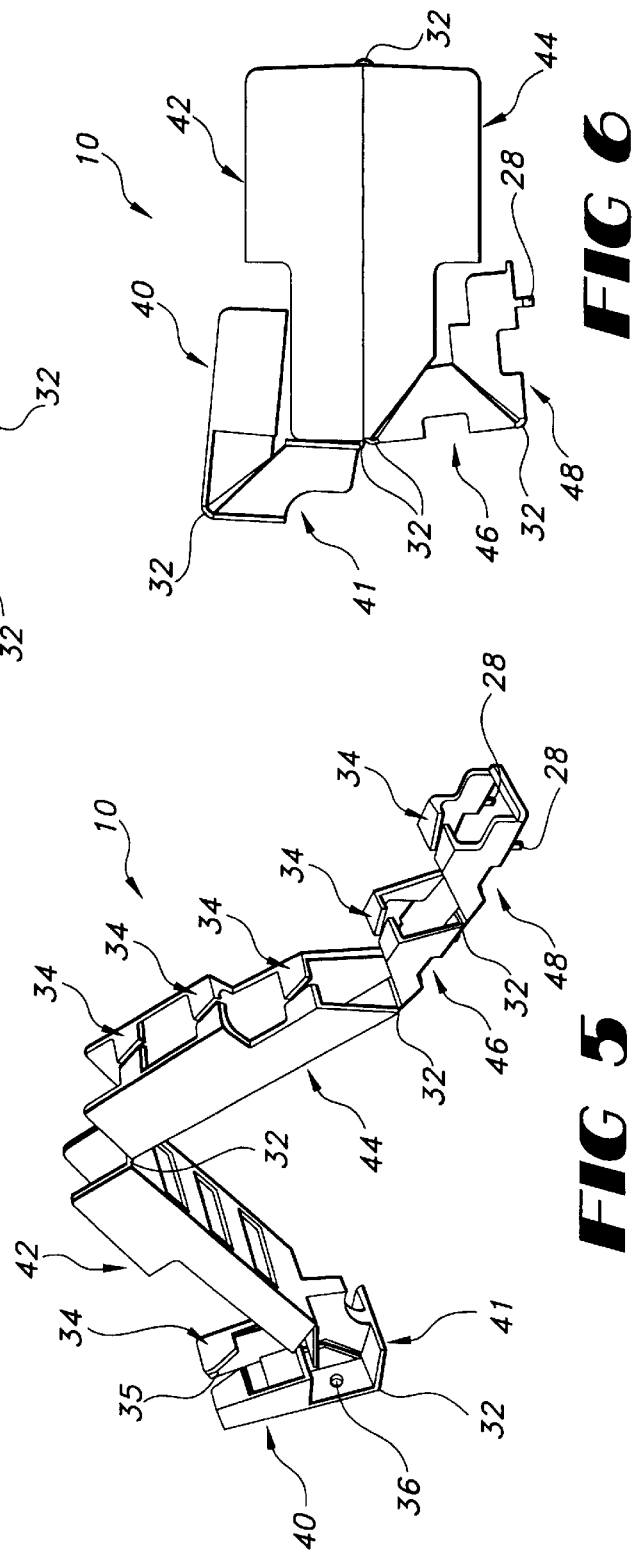

SINGLE PIECE, HINGED CABLE ROUTING DEVICE

FIELD OF THE INVENTION

This invention relates to cable routing devices, and, more particularly, to stems and methods of providing a single piece, hinged cable routing device.

BACKGROUND OF THE INVENTION

Cable television (CATV) systems typically include transmission equipment, such as headend equipment that receives satellite signals and demodulates the signals to baseband. The baseband signal is then converted to a radio frequency (RF) signal or optical signal for transmission over a distribution system, such as, for example, a fiber optic cable, from the headend to receiving equipment, such as a set top box. The set top box couples to the subscriber's equipment, such as, for instance, a television set. The distribution system can encompass multiple distribution lines that can include local or long distance trunk lines, such as coax cable lines, directional couplers, and amplifiers that provide additional power to spread the signals to cable television taps along the CATV system.

Amplifiers are normally contained in a housing on a line. One side of the cable from the head end couples to one side of the housing. The cable feeds through the housing to amplification equipment and out of the housing to receiving equipment or taps having output ports for relaying the signal to subscribers.

Amplifier housings typically encompass two halves that close. Normally the amplifiers have electronics in both halves of the housings that are connected with a flexible cable that goes from one side of the half to the other. Folding the cables into the amplifier housing can cause noise problems. For example, the cables may be bent too tightly or the cables may stick out when folded and become caught in the housing when closed. Even if the cables do not get pinched by the housing, presently, the position where the cables fold up is unpredictable causing the cables to end up too close to the electronic components housed within the housing causing electrical interference.

Thus, a need exists for an apparatus that allows cables to be housed within an amplifier housing without getting pinched between the halves of the amplifier housing and does not cause electrical interference and noise.

SUMMARY OF THE INVENTION

This invention addresses the prior problems and provides for a single piece, hinged cable routing device (also referred to as a "carrier") for an amplifier housing. The unitary carrier includes sections flexibly joined with "living hinges" that allow the carrier to bend as it folds and unfolds when the amplifier housing is opened and closed. The device can include fingers along one side that allow for ease of installation of wires and cables. Preferably, the device is a single injection molded part having two ends and attaches to one half of the amplifier housing at one end and attaches to the other half of the amplifier housing at the other end.

One, multiple or combinations of the objects of this invention include the following:

To provide systems and methods for a device that holds a cable that couples to an amplifier such that the cable always folds into the same location when the housing is closed.

To provide systems and methods for a device that holds a cable in an amplifier housing such that it does not cause electrical noise problems.

To provide systems and methods for a device that folds completely when enclosed within a housing.

To provide a device that eliminates cables being damaged out in the field when an amplifier housing closes.

Other objects and advantages of this invention will become apparent to those skilled in the art upon review of this document and the Figures.

BRIEF DESCRIPTION OF THE DRAWINGS

FIG. 4 is a side view of the single piece, hinged cable routing device of FIG. 1 flexing around its living hinges.

FIG. 5 is a perspective view showing the flexibility of the single piece, hinged cable routing device of FIG. 1.

FIG. 6 is a side view of the single piece, hinged cable routing device of FIG. 1 as it would appear completely folded within a closed amplifier housing.

DETAILED DESCRIPTION

FIGS. 1–6 show various views of a single piece, hinged cable routing device of this invention.

Figure 1:
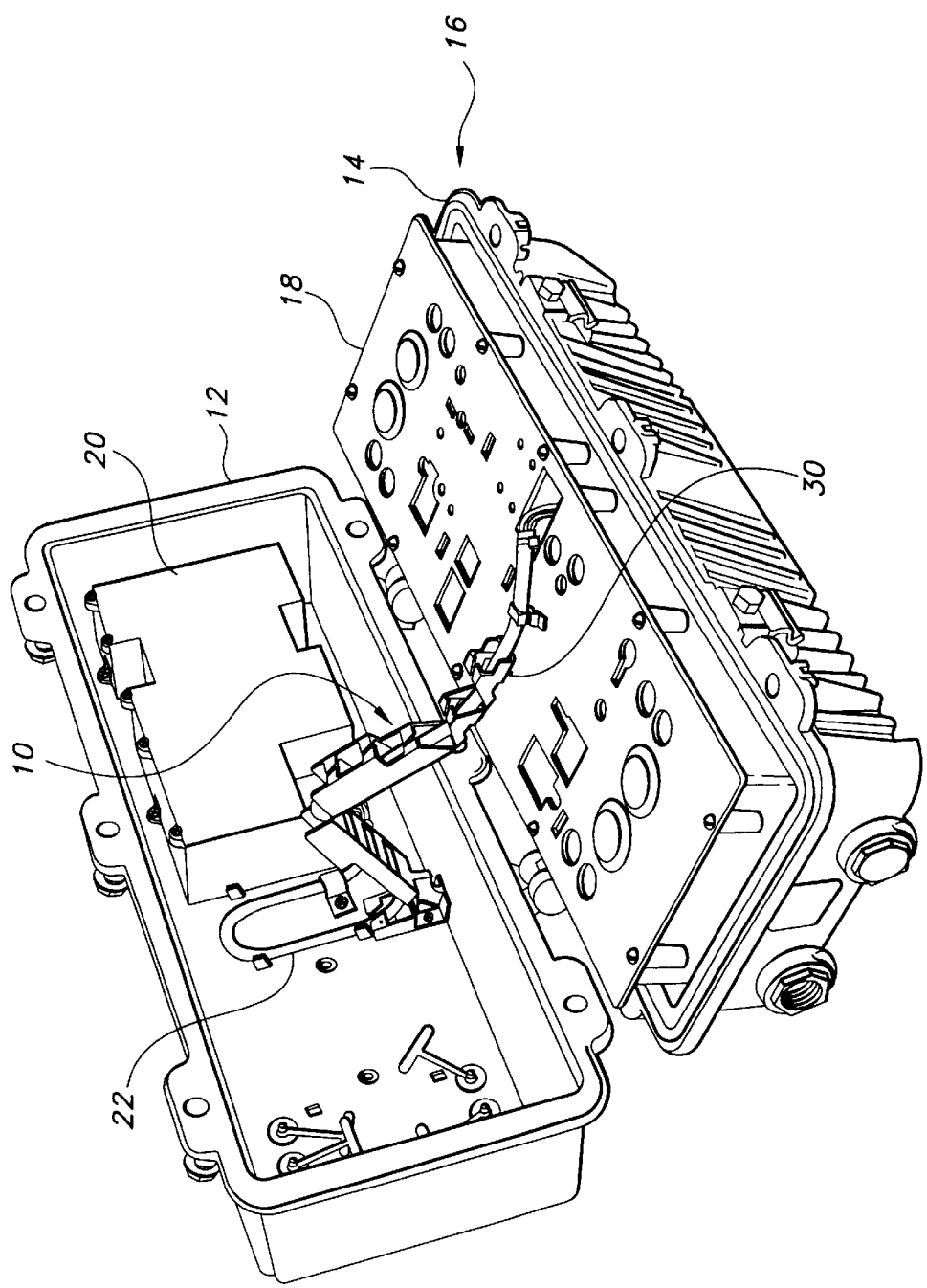
FIG. 1 is a perspective view of an amplifier housing having modules and a single piece, hinged cable routing device of this invention.

FIG. 1 shows a perspective view of the single piece, hinged cable routing device 10 (also referred to as a "carrier") attached to an upper half 12 and a lower half 14 of an amplifier housing 16. In a preferred embodiment, the carrier 10 is positioned in the middle of the amplifier housing 16. An amplifier module 18 utilized in a cable television or communications network can be reversible. That is, the amplifier module 18 can be positioned in the amplifier housing 16 with a RF input entering from the left or right ends of the amplifier housing 16. A centrally located carrier 10 allows the amplifier housing 16 to face the same direction regardless of whether the RF input enters from the left or right end of the amplifier housing 16.

The amplifier housing 16 includes components for boosting the signal from a transmitter such as a headend device. Normally, amplifiers include modules such as those containing electronic components 18, and a power supply module 20. The electronic components 18 can reside on both the top half 12 and the bottom half 14 of the amplifier housing 16. Cables 22 snake through the carrier 10 to connect the cable 22 from the top half 12 to the bottom half 14 of the amplifier housing 16.

Electronics can be placed in both halves of the amplifier housing 16. Alternatively, the electronic modules 18 reside on the bottom half 14 of the amplifier housing 16 and the power supply module 20 resides on the top half 12 of the amplifier housing 16. The placement of the power supply module 20 on the top half 12 of the amplifier housing 16 provides for heat dissipation out of the top of the amplifier housing 16 and not through the bottom 14 of the amplifier housing 16. Suitable amplifiers for use with this invention are the GainMaker™ series of products, provided by Scientific-Atlanta, Inc. of Norcross, Ga., such as System Amplifier 4 and Line Extender 4.

Figure 2:
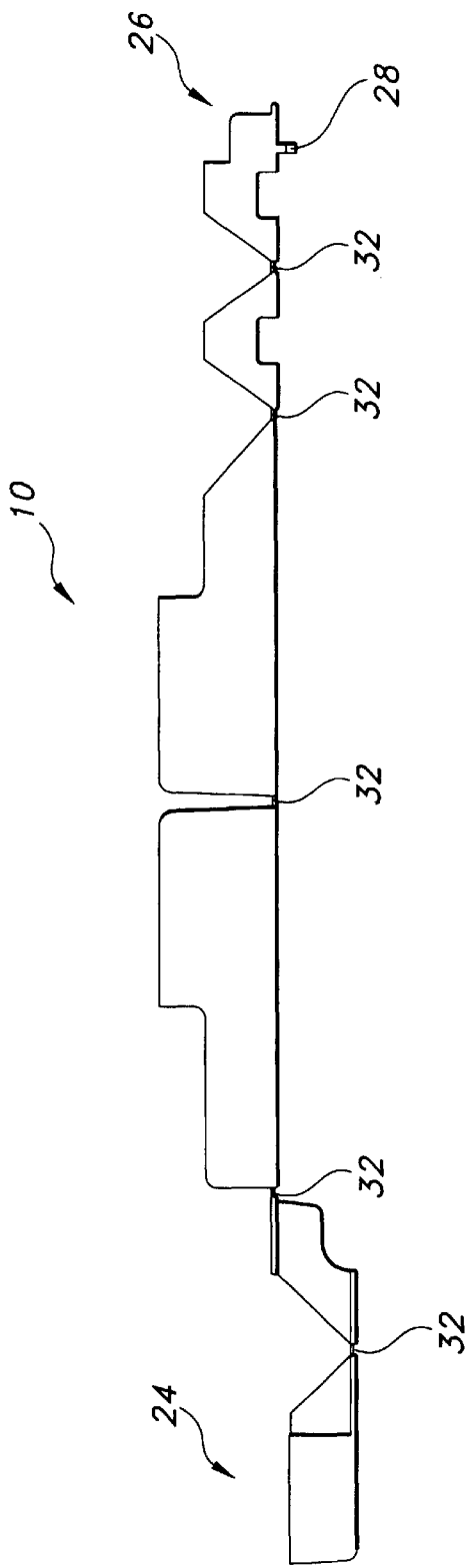
FIG. 2 is a side view of the single piece, hinged cable routing device of FIG. 1.

FIG. 2 shows a side view of the single piece, hinged cable routing device 10. In a preferred embodiment, the carrier 10 encompasses an injection molded single piece of polypropylene, about 9.5 inches long and about 1.4 inches high. The carrier 10 can be pre-attached to the amplifier housing 16 by attaching one end 24 of the carrier 10 to the top side 12 of the amplifier housing 16. The other end 26 of the carrier 10 can snap in place utilizing tabs 28 that mate to corresponding holes 30 (shown in FIG. 1) in the bottom half of the amplifier housing 16. Optionally, the other end 26 of the carrier 10 can attach to the electronic module 18 of bottom half 14 of the amplifier housing 16. Alternatively, the customer (e.g. a cable operator) can assemble the carrier 10 to the amplifier housing 16 in the field.

The carrier 10 includes living hinges 32 that flex but do not break when bent. The living hinges 32 allow the carrier 10 to bend in the same location when the carrier 10 folds and unfolds as the amplifier housing 16 opens and closes.

Figure 3:
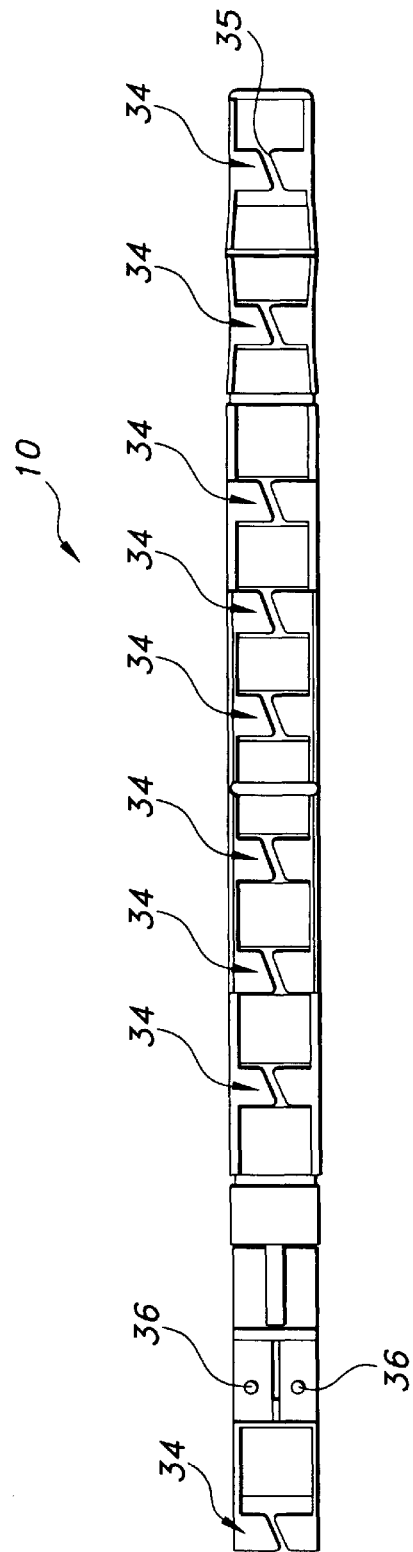
FIG. 3 is a top view of the single piece, hinged cable routing device of FIG. 1.

FIG. 3 shows a top view of the single piece, hinged cable routing device 10. The carrier 10 has wire retention fingers 34 that provide for ease of inserting cables 22 into the carrier 10. Each finger 34 includes a gap 35. Cables 22 insert into the carrier 10 by pushing the cable 22 through the gap 35 in the fingers 34. The fingers 34 allow for ease of installing the cable 22 but also secure the cable 22 in position such that the cable 22 will not inadvertently move out of position from the carrier 10. In an alternative embodiment, the gap 35 is eliminated and the fingers 34 are molded together. In this embodiment, the cable 22 inserts by being threaded through the carrier 10. Openings 36 in the carrier 10 provide for attaching the carrier 10 to the top side 12 of the amplifier housing 16 by, for example, screwing the carrier 10 to the amplifier housing 16. The carrier 10 can be attached to the top side 12 of the amplifier housing 16 by a variety of methods including welding, bolting, gluing, and snapping the carrier 10 into position.

FIG. 4 shows a side view of the carrier 10 bending around the living hinges 32. Cables 22 of a variety of sizes with a variety of bend radius requirements can be utilized with the carrier 10. The segments 40, 41, 42, 44, 46 and 48 of the carrier 10 can be designed to support the different bend radii. For example, cables 22 from about 0.25 to 2.1 inches in diameter can be fed through the carrier 10. Depending on the diameter of the cable 22, up to three cables 22 can be enclosed within the carrier 10.

FIG. 5 shows a perspective view of the bendability of the single piece, hinged cable routing device 10. This view is exemplary of the position of the carrier 10 when the amplifier housing 16 is in an open position. The carrier 10 connects to the top side 12 of the amplifier housing 16 utilizing the openings 36 in the carrier 10.

FIG. 6 shows a side view of the single piece, hinged cable routing device 10 completely folded when the amplifier housing 16 is in a closed position. Flexing the living hinges 32 bends each section 40, 41, 42, 44, 46 and 48 and thus the carrier 10 transitions to a folded position. In this position, the cable 22 is securely enclosed within the carrier 10. In a preferred embodiment, the power supply 20 extends about one-half inch from the interior of the top half 12 of the amplifier housing 16 and the carrier 10 fits within this space when folded. The bend of the carrier 10 is such that cable 22 bending radius are maintained in a manner that interference is not introduced by an improper bend of the cable 22.

In an alternative embodiment, the carrier is molded to both the top side and bottom side of the amplifier housing.

In another alternative embodiment, the carrier encompasses two pieces that each attach to a half of the amplifier housing and are joined by a living hinge.

In yet another alternative embodiment, the carrier snaps into position utilizing tabs on both ends of the carrier mating to holes on both the top side and bottom side of the amplifier housing.

An advantage of this invention is that it avoids cables being pinched between the halves of the amplifier housing when the amplifier housing closes.

Another advantage of this invention is that the cable securely enclosed within the carrier avoids introducing electrical interference into the CATV system that arises when cables are placed too close to electrical components.

In light of the foregoing disclosure of this invention and description of certain preferred embodiments, those who are skilled in this area of technology will readily understand that various modifications and adaptations can be made without departing from the true scope and spirit of this invention. All such modifications and adaptations are intended to be covered by the following claims.

What is claimed is:

1. An apparatus for connecting cables to an amplifier housing, comprising;
   a routing device having a plurality of sections capable of folding and unfolding, the sections further comprising:
   a first section capable of attaching to a first half of the amplifier housing and having fingers adapted to receive the cables;
   a second section hingedly connected to the first section;
   a third section hingedly connected to the second section having fingers adapted to receive the cables on a first side of the third section;
   a fourth section hingedly connected to the third section having fingers adapted to receive the cables on a first side of the fourth section;
   a fifth section hingedly connected to the fourth section having fingers adapted to receive the cables on a first side of the fifth section; and
   a sixth section hingedly connected to the fifth section having fingers adapted to receive the cables on a first side of the sixth section and capable of attaching to a second half of the amplifier housing.

2. The apparatus of 1, wherein the sixth section further comprises tabs affixed to a second side of the sixth section for attaching the sixth section to the second half of the amplifier housing.

3. The apparatus of 1, wherein the first section attaches to the first half of the amplifier housing using screws.

4. The apparatus of claim 1, wherein the routing device comprises a single piece, hinged device.

5. The apparatus of claim 1, wherein the routing device folds to fit within the amplifier housing when the amplifier housing closes.

6. The apparatus of claim 1, wherein the routing device comprises fewer than six sections.

* * * * *

UNITED STATES PATENT AND TRADEMARK OFFICE
CERTIFICATE OF CORRECTION

PATENT NO.    : 6,320,131 B1
DATED         : November 20, 2001
INVENTOR(S)   : McCann It is certified that error appears in the above-identified patent and that said Letters Patent is hereby corrected as shown below:

<u>Column 1,</u>
Line 6, delete "stems" and insert therefore -- systems --

Signed and Sealed this

Fourth Day of June, 2002

Attest:

Attesting Officer

JAMES E. ROGAN
*Director of the United States Patent and Trademark Office*